United States Patent
Varanasi et al.

(10) Patent No.: US 9,938,619 B2
(45) Date of Patent: Apr. 10, 2018

(54) CHEMICAL VAPOR DEPOSITION PROCESS FOR DEPOSITING A TITANIUM OXIDE COATING

(71) Applicant: Pilkington Group Limited, Lathom (GB)

(72) Inventors: Srikanth Varanasi, Ottawa Hills, OH (US); Jun Ni, Maumee, OH (US); Douglas M. Nelson, Curtice, OH (US)

(73) Assignee: Pilkington Group Limited, Lathom (GB)

(*) Notice: Subject to any disclaimer, the term of this patent is extended or adjusted under 35 U.S.C. 154(b) by 0 days.

(21) Appl. No.: 14/848,475

(22) Filed: Sep. 9, 2015

(65) Prior Publication Data

US 2016/0076144 A1   Mar. 17, 2016

Related U.S. Application Data

(60) Provisional application No. 62/048,937, filed on Sep. 11, 2014.

(51) Int. Cl.
*C23C 16/00* (2006.01)
*C23C 16/40* (2006.01)
(Continued)

(52) U.S. Cl.
CPC .......... *C23C 16/40* (2013.01); *C03C 17/2456* (2013.01); *C23C 16/455* (2013.01);
(Continued)

(58) Field of Classification Search
CPC ........ C23C 16/40; C23C 16/455; C23C 16/08
See application file for complete search history.

(56) References Cited

U.S. PATENT DOCUMENTS 5,597,515 A * 1/1997 Kauffman .............. B82Y 30/00
                                                   252/519.12
6,071,561 A * 6/2000 Gordon ................. C23C 16/407
                                                   427/126.3
(Continued)

FOREIGN PATENT DOCUMENTS

EP          0962428 A1    12/1999

OTHER PUBLICATIONS

Kafizas, A. et al.: "Combinatorial Atmospheric Pressure Chemical Vapor Deposition of F:TiO2; the Relationship between Photocatalysis and Transparent Conducting Oxide Properties" Advanced Functional Materials, Wiley—VCH Verlag GmbH & Co, KGAA, DE, vol. 24, No. 12, Mar. 26, 2014, pp. 1758-1771 [retrieved on Nov. 19, 2013].

*Primary Examiner* — Kelly M Gambetta
(74) *Attorney, Agent, or Firm* — Marshall & Melhorn, LLC

(57) ABSTRACT

A chemical vapor deposition process for depositing a titanium oxide coating is provided. The chemical vapor deposition process for depositing the titanium oxide coating includes providing a glass substrate. A gaseous mixture is formed. The gaseous mixture includes a titanium-containing compound and a fluorine-containing compound. The titanium-containing compound is an oxygen-containing compound or the gaseous mixture includes a first oxygen-containing compound. The gaseous mixture is directed toward and along the glass substrate. The mixture reacts over the glass substrate to form the titanium oxide coating thereon.

19 Claims, 1 Drawing Sheet

(51) Int. Cl.
*C23C 16/455* (2006.01)
*C03C 17/245* (2006.01)

(52) U.S. Cl.
CPC .. *C03C 2217/212* (2013.01); *C03C 2217/241* (2013.01); *C03C 2217/285* (2013.01); *C03C 2218/1525* (2013.01)

(56) References Cited

U.S. PATENT DOCUMENTS

| | | | |
|---|---|---|---|
| 6,113,983 | A | 9/2000 | Zachariah et al. |
| 6,238,738 | B1 * | 5/2001 | McCurdy ............ C03C 17/2453 427/166 |
| 6,268,019 | B1 * | 7/2001 | Florczak ............... C03C 17/245 427/166 |
| 2005/0003644 | A1 * | 1/2005 | Remington, Jr. ..... C03C 17/225 438/584 |
| 2006/0228476 | A1 | 10/2006 | McCurdy |
| 2010/0202960 | A1 | 8/2010 | Enomura |
| 2010/0313936 | A1 * | 12/2010 | Nghiem .............. C03C 17/3417 136/252 |
| 2015/0122319 | A1 | 5/2015 | Strickler et al. |

* cited by examiner

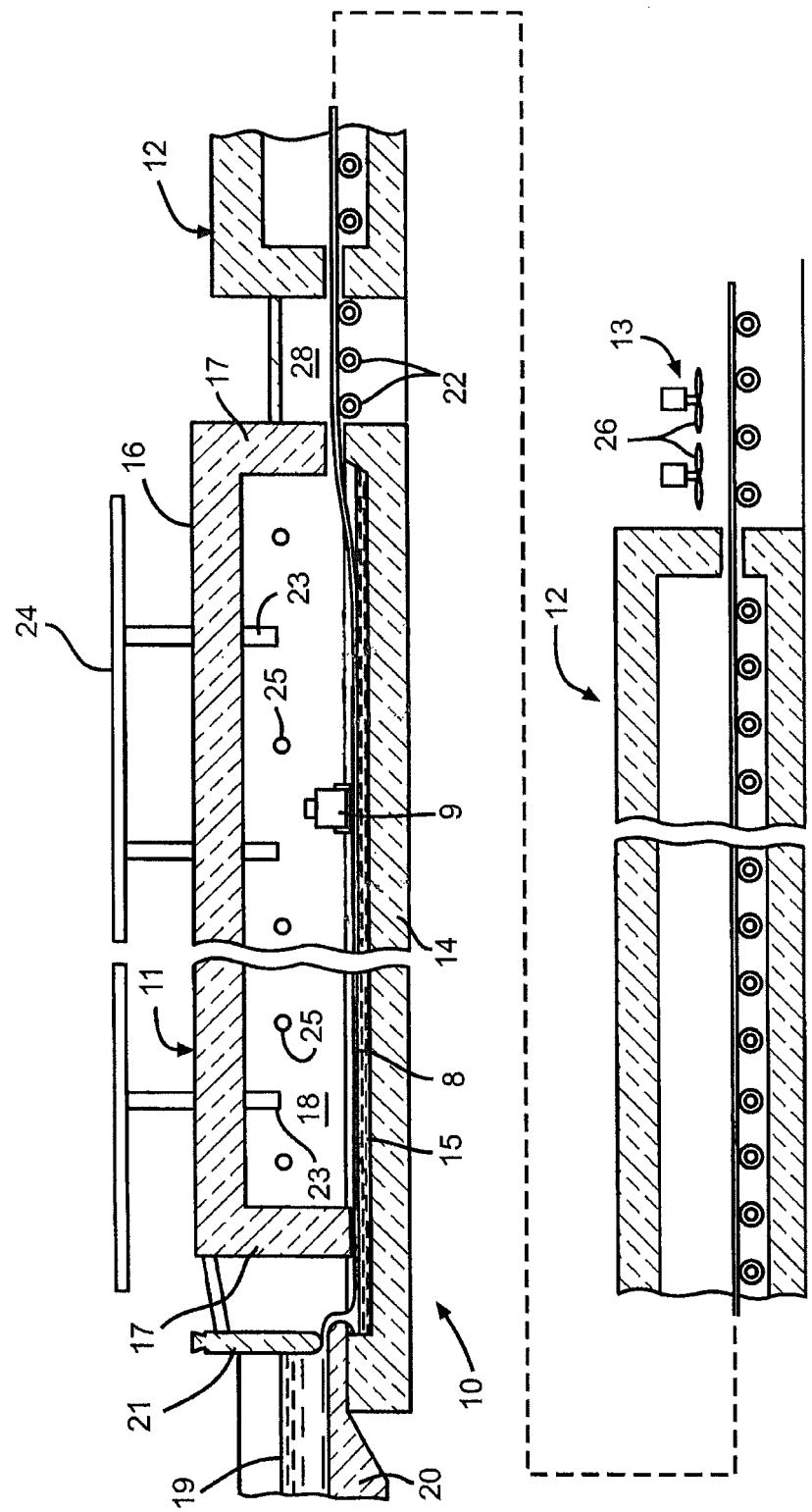

CHEMICAL VAPOR DEPOSITION PROCESS FOR DEPOSITING A TITANIUM OXIDE COATING

CROSS-REFERENCE TO RELATED APPLICATION

This application is claiming the benefit, under 35 U.S. C. 119(e), of the provisional U.S. patent application which was granted Ser. No. 62/048,937 and filed on Sep. 11, 2014, the entire disclosure of which is hereby incorporated by reference.

BACKGROUND OF THE INVENTION

This invention relates in general to a chemical vapor deposition (CVD) process for depositing a titanium oxide coating.

Processes for depositing titanium oxide coatings are known. However, the known processes utilize expensive precursor compounds and/or are limited by the efficiency of the deposition process. Therefore, it is desired to devise an improved process for depositing a titanium oxide coating.

BRIEF SUMMARY OF THE INVENTION

In an embodiment, a chemical vapor deposition process for depositing a titanium oxide coating is provided. The chemical vapor deposition process for depositing the titanium oxide coating comprises providing a glass substrate. A gaseous mixture is formed that comprises a titanium-containing compound and a fluorine-containing compound. The titanium-containing compound is an oxygen-containing compound or the gaseous mixture includes a first oxygen-containing compound. The gaseous mixture is directed toward and along the glass substrate. The mixture is reacted over the glass substrate to form the titanium oxide coating thereon.

In another embodiment, an atmospheric pressure chemical vapor deposition process for depositing a titanium oxide coating is provided. The atmospheric pressure chemical vapor deposition process for depositing the titanium oxide coating comprises providing a glass ribbon in a float glass manufacturing process. A gaseous mixture is formed that comprises an inorganic, halogenated titanium containing compound, an oxygen-containing organic compound, an inorganic fluorine-containing compound and one or more inert gases. The gaseous mixture is delivered to a coating apparatus. The coating apparatus is provided at a predetermined distance above and extends transversely across the glass ribbon. The glass ribbon is surrounded by float bath atmosphere. The gaseous mixture is discharged from the coating apparatus and directed toward and along the glass ribbon. The mixture reacts over the glass ribbon to form the titanium oxide coating directly thereon.

In a further embodiment, an atmospheric pressure chemical vapor deposition process for depositing a titanium oxide coating is provided. The atmospheric pressure chemical vapor deposition process for depositing the titanium oxide coating comprises providing a moving glass substrate having an uncoated deposition surface at essentially atmospheric pressure. Titanium tetrachloride, ethyl acetate, and hydrogen fluoride and one or more inert gases are mixed to form a gaseous mixture. The gaseous mixture is delivered to a coating apparatus. The coating apparatus is provided at a predetermined distance above the glass substrate. The gaseous mixture is discharged from the coating apparatus and directed toward and along the glass substrate. The mixture is reacted over the deposition surface of the glass substrate to form a titanium dioxide coating directly thereon. The titanium dioxide coating has a refractive index of 2.1 or more.

BRIEF DESCRIPTION OF THE DRAWING

The above, as well as other advantages of the process will become readily apparent to those skilled in the art from the following detailed description when considered in the light of the accompanying drawing in which the FIGURE depicts a schematic view, in vertical section, of an installation for practicing the float glass manufacturing process in accordance with certain embodiments of the invention.

DETAILED DESCRIPTION OF THE INVENTION

It is to be understood that the invention may assume various alternative orientations and step sequences, except where expressly specified to the contrary. It is also to be understood that the specific articles, apparatuses and processes described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in the various embodiments described within this section of the application may be commonly referred to with like reference numerals.

In an embodiment, a CVD process for depositing a titanium oxide coating (hereinafter also referred to as the "CVD process") is provided. The CVD process will be described in connection with a coated glass article. The coated glass article may be utilized in architectural glazings, electronics, and/or have automotive, aerospace and solar cell applications.

The titanium oxide coating contains primarily titanium and oxygen. The titanium oxide coating may contain contaminants of, for example, carbon, chlorine and/or fluorine. Preferably, when the titanium oxide coating contains contaminants, the contaminants are provided in trace amounts or less. Preferably, the titanium oxide coating is titanium dioxide. More preferably, the titanium oxide coating is stoichiometric titanium dioxide. Titanium dioxide coatings may be designated herein by utilizing the chemical formula $TiO_2$. In certain embodiments, a titanium oxide coating which is slightly oxygen deficient may also be provided and may be useful. Thus, the titanium oxide coating may be of another suitable stoichiometry.

A feature of the CVD process is that it allows for the formation of titanium oxide coatings at commercial viable deposition rates. For example, utilizing the CVD process, the titanium oxide coating may be formed at a dynamic deposition rate of 40 angstroms per second (Å/sec.) or more. Additionally, an advantage of the CVD process is that it is more efficient than known processes for forming titanium oxide coatings. Thus, commercially viable deposition rates can be achieved using less precursor materials than in the known processes which reduce the costs to form such coatings. For example, in an embodiment of the CVD process, the titanium oxide coating can formed directly on a deposition surface of a glass substrate without the need to deposit a nucleation coating layer of, for example, silica ($SiO_2$) or tin oxide ($SnO_2$) prior to forming the titanium oxide coating.

The CVD process also provides additional advantageous features. For example, the CVD process allows for the haze exhibited by a coated glass article having a titanium oxide coating formed by the CVD process to be increased or decreased. It should be appreciated that haze is an important feature for coated glass articles utilized in certain applications such as, for example, certain OLED applications. In certain embodiments, when the titanium oxide coating is the outermost coating layer of the coated glass article, the coated glass article may exhibit haze of less than 0.3%. In other embodiments, when a coating such as, for example, a silica coating is formed over the titanium oxide coating, the haze exhibited by the coated glass article may be greater than 0.45%. Hence, the haze exhibited by a coated glass article can be increased or decreased by selecting the position of the titanium oxide coating on the coated glass article.

The CVD process comprises providing the glass substrate. The glass substrate comprises the deposition surface over which the titanium oxide coating is formed. In an embodiment, the glass substrate is a soda-lime-silica glass. However, the CVD process is not limited to a soda-lime-silica glass substrate as, in other embodiments, the glass substrate may be a borosilicate glass. Additionally, it may be preferable to utilize a glass substrate having a low iron content in practicing the process. Thus, in certain embodiments, the CVD process is not limited to a particular substrate composition.

Further, in certain embodiments, the glass substrate is substantially transparent. However, the invention is not limited to transparent glass substrates as translucent glass substrates may also be utilized in practicing the CVD process. Also, the transparency or absorption characteristics of the substrate may vary between embodiments. Additionally, the CVD process can be practiced utilizing a clear or a colored glass substrate and is not limited to a particular glass substrate thickness.

The CVD process may be carried out in conjunction with the manufacture of the glass substrate. In an embodiment, the glass substrate may be formed utilizing the well-known float glass manufacturing process. An example of a float glass manufacturing process is illustrated in the FIGURE. In this embodiment, the glass substrate may also be referred to as a glass ribbon. However, it should be appreciated that the CVD process can be utilized apart from the float glass manufacturing process or well after formation and cutting of the glass ribbon.

In certain embodiments, the CVD process is a dynamic deposition process. In these embodiments, the glass substrate is moving at the time of forming the titanium oxide coating. Preferably, the glass substrate moves at a predetermined rate of, for example, greater than 3.175 m/min (125 in/min) as the titanium oxide coating is being formed thereon. In an embodiment, the glass substrate is moving at a rate of between 3.175 m/min (125 in/min) and 12.7 m/min (600 in/min) as the titanium oxide coating is being formed.

In certain embodiments, the glass substrate is heated. In an embodiment, the temperature of the glass substrate is about 1100° F. (593° C.) or more when the titanium oxide coating is deposited thereover or thereon. In another embodiment, the temperature of the glass substrate is between about 1100° F. (593° C.) and 1400° F. (760° C.).

Preferably, the titanium oxide coating is deposited on the deposition surface of the glass substrate while the surface is at essentially atmospheric pressure. In this embodiment, the CVD process is an atmospheric pressure CVD (APCVD) process. However, the CVD process is not limited to being an APCVD process as, in other embodiments, the titanium oxide coating may be formed under low-pressure conditions.

The CVD process may comprise providing a source of a titanium-containing compound, a source of one or more oxygen-containing compounds, a source of a fluorine-containing compound, and a source of one or more inert gases. Preferably, these sources are provided at a location outside the float bath chamber. Separate supply lines may extend from the sources of reactant (precursor) compounds and the one or more carrier gases. As used herein, the phrases "reactant compound" and "precursor compound" may be used interchangeably to refer any or all of the titanium-containing compound, oxygen-containing compounds, and fluorine-containing compound, and/or used to describe the various embodiments thereof disclosed herein.

The CVD process also comprises forming a gaseous mixture. As would be appreciated by those skilled in the art, the precursor compounds suitable for use in the gaseous mixture should be suitable for use in a CVD process. Such compounds may at some point be a liquid or a solid but are volatile such that they can be vaporized for use in the gaseous mixture. In certain embodiments, the gaseous mixture includes precursor compounds suitable for forming the titanium oxide coating at essentially atmospheric pressure. Once in a gaseous state, the precursor compounds can be included in a gaseous stream and utilized in the CVD process to form the titanium oxide coating.

For any particular combination of gaseous precursor compounds, the optimum concentrations and flow rates for achieving a particular deposition rate and titanium oxide coating thickness may vary. However, in order to form a titanium oxide coating as is provided by the CVD process described herein, the gaseous mixture comprises the titanium-containing compound, an oxygen-containing compound and the fluorine-containing compound.

In certain embodiments, the titanium-containing compound is an inorganic titanium-containing compound. Preferably, in these embodiments, the titanium-containing compound is an inorganic, halogenated titanium-containing compound. An example of an inorganic, halogenated titanium-containing compound suitable for use in the forming the gaseous mixture is titanium tetrachloride ($TiCl_4$). Titanium tetrachloride is preferred because it is relatively inexpensive and it does not include carbon, which can become trapped in the titanium oxide coating during formation of the coating. However, the invention is not limited to titanium tetrachloride as other halogenated titanium-containing compounds may be suitable for use in practicing the CVD process.

In other embodiments, the titanium-containing compound is an organic titanium-containing compound. Preferably, in these embodiments, the titanium-containing compound is a titanium alkoxide compound. An example of a titanium alkoxide compound suitable for use in the forming the gaseous mixture is titanium isopropoxide $Ti[OCH(CH_3)_2]_4$. Another example of a titanium alkoxide compound suitable for use in the forming the gaseous mixture is titanium ethoxide $Ti(OEt)_4$. However, the invention is not limited to titanium isopropoxide and titanium ethoxide as other organic titanium-containing compounds may be suitable for use in practicing the CVD process.

In the embodiments where the titanium-containing compound is an organic titanium-containing compound, the titanium-containing compound is also an oxygen-containing compound. Thus, in these embodiments, the gaseous mixture may only include the titanium-containing precursor compound and the fluorine-containing precursor compound to form the titanium oxide coating on the glass substrate. Alternatively, when the titanium-containing compound does not include oxygen, the gaseous mixture includes the titanium-containing compound, the fluorine-containing compound, and a first oxygen-containing compound. For example, when the titanium-containing is titanium tetrachloride, the gaseous mixture also includes the first oxygen-containing compound.

In an embodiment, the first oxygen-containing compound is an oxygen-containing organic compound such as, for example, a carbonyl compound. Preferably, the carbonyl compound is an ester. More preferably, the carbonyl compound is an ester having an alkyl group with a β hydrogen. Alkyl groups with a β hydrogen containing two to ten carbon atoms are preferred. Preferably, the ester is ethyl acetate (EtoAc). However, in other embodiments, the ester is one of ethyl formate, ethyl propionate, isopropyl formate, isopropyl acetate, n-butyl acetate or t-butyl acetate.

In certain embodiments, the gaseous mixture may also comprise a second oxygen-containing compound. In an embodiment, the second oxygen-containing compound is an oxygen-containing inorganic compound. In one such embodiment, the second oxygen-containing compound oxygen is $O_2$. In these embodiments, it is preferred that the oxygen provided by the second oxygen-containing compound is in the form of molecular oxygen.

In an embodiment, the fluorine-containing compound is an inorganic fluorine-containing compound. A preferred inorganic fluorine-containing compound is hydrogen fluoride (HF). Alternatively, in an embodiment, the fluorine-containing compound may be an organic fluorine-containing compound such as, for example, trifluoroacetic acid (TFA).

In general and as an example, utilizing only a halogenated titanium-containing compound such as titanium tetrachloride and an oxygen-containing compound such as ethyl acetate in a gaseous mixture for a CVD process fails to produce a coating of titanium oxide directly on the glass substrate or produces a coating of titanium oxide on the glass substrate at a low deposition rate. However, it has been discovered that with the addition of the fluorine-containing compound to the gaseous mixture, a titanium oxide coating can be deposited directly on the glass substrate at an improved and commercially acceptable deposition rate.

In certain embodiments of the CVD process, the deposition rate of the titanium oxide coating may increase by increasing the amount of the fluorine-containing compound in the gaseous mixture. For example, in an embodiment, the deposition rate of the titanium oxide coating increases until the gaseous mixture comprises up to about 1.16 mol % fluorine-containing compound. Thus, in certain embodiments of the process, the precursor mixture comprises up to about 1.16 mol % fluorine-containing compound. However, it has been observed that when the gaseous mixture comprises more than about 1.16 mol % fluorine-containing compound, the deposition rate of the titanium oxide coating decreases. Nonetheless, in certain embodiments, the gaseous mixture may comprise more than 1.16 mol % fluorine-containing compound, as a titanium oxide coating within the scope of the embodiments described herein is still deposited directly on the glass substrate under these conditions. As such, in certain embodiments of the process, the precursor mixture comprises 1.16 mol % or more fluorine-containing compound.

In certain embodiments, the titanium-containing compound is titanium isopropoxide and the fluorine-containing compound is hydrogen fluoride. Thus, in these embodiments, the gaseous mixture comprises titanium isopropoxide and hydrogen fluoride. In other embodiments, the titanium-containing compound is titanium ethoxide and the fluorine-containing compound is hydrogen fluoride. In these embodiments, the gaseous mixture comprises titanium ethoxide and hydrogen fluoride. In still other embodiments, the titanium-containing compound is titanium tetrachloride, the first oxygen-containing compound is ethyl acetate and the fluorine-containing compound is hydrogen fluoride. Thus, in these embodiments, the gaseous mixture comprises titanium tetrachloride, ethyl acetate and hydrogen fluoride. Further, in these embodiments, it may be preferred to practice the CVD process by providing and maintaining a ratio of the first oxygen-containing compound to the titanium-containing compound in the gaseous mixture. For example, in an embodiment, the ratio of ethyl acetate to titanium tetrachloride in the gaseous mixture is from 1:1 to 5:1. Preferably, the ratio of ethyl acetate to titanium tetrachloride in the precursor mixture is from 1.5:1 to 3:1. More preferably, the ratio of ethyl acetate to titanium tetrachloride in the precursor mixture is about 2:1 to 2.5:1. In certain embodiments, the gaseous mixture may comprise about 0.2 mol % or more titanium tetrachloride, about 0.4 mol % or more ethyl acetate, and about 1.2 mol % or more hydrogen fluoride. In these embodiments, the gaseous mixture may also comprise 1.5 mol % or more $O_2$.

In an embodiment, the fluorine-containing compound is mixed with the titanium-containing compound to form the gaseous mixture. In another embodiment, the fluorine-containing compound is mixed with the titanium-containing compound and the first oxygen-containing compound to form the gaseous mixture. In yet another embodiment, the fluorine-containing compound is mixed with the titanium-containing compound, the first oxygen-containing compound, and the second oxygen-containing compound to form the gaseous mixture. Thus, in these embodiments, the CVD process comprises mixing the precursor compounds to form the gaseous mixture.

In an embodiment, the CVD process comprises mixing titanium ethoxide and hydrogen fluoride to form the gaseous mixture. In another embodiment, the CVD process comprises mixing titanium isopropoxide and hydrogen fluoride to form the gaseous mixture. Preferably, the CVD process comprises mixing titanium tetrachloride, ethyl acetate and hydrogen fluoride to form the gaseous mixture. More preferably, the CVD process comprises mixing titanium tetrachloride, ethyl acetate, $O_2$ and hydrogen fluoride to form the gaseous mixture. The precursor compounds are mixed and maintained at a temperature to avoid premature reaction. Those skilled in the art would appreciate that, when premature reaction does occur, undesirable powder may form in the coating apparatus or on the glass substrate. Hence, the CVD process can be operated for an extended period of time which further reduces the cost and complexity to produce the titanium oxide coating.

The gaseous mixture may also comprise one or more inert gases utilized as carrier or diluent gas. Suitable inert gases include nitrogen ($N_2$), helium (He) and mixtures thereof.

Thus, the CVD process may comprise providing a source of the one or more inert gases from which separate supply lines may extend.

Preferably, the gaseous mixture is delivered to a coating apparatus. In certain embodiments, the gaseous mixture is fed through a coating apparatus prior to forming the titanium oxide coating and discharged from the coating apparatus utilizing one or more gas distributor beams. Descriptions of coating apparatuses suitable for being utilized in the CVD process can be found in published U.S. patent application no. 2012/0240627 and U.S. Pat. No. 4,922,853, the entire disclosures of which are hereby incorporated by reference.

Preferably, the gaseous mixture is formed prior to being fed through the coating apparatus. For example, the precursor compounds may be mixed in a feed line connected to an inlet of the coating apparatus. In other embodiments, the gaseous mixture may be formed within the coating apparatus. The gaseous mixture is directed toward and along the glass substrate. Utilizing a coating apparatus aids in directing the gaseous mixture toward and along the glass substrate. Preferably, the gaseous mixture is directed toward and along the glass substrate in a laminar flow.

Preferably, the coating apparatus extends transversely across the glass substrate and is provided at a predetermined distance thereabove. The coating apparatus is preferably located at a predetermined location. When the CVD process is utilized in conjunction with the float glass manufacturing process, the coating apparatus is preferably provided within the float bath section thereof. However, the coating apparatus may be provided in the annealing lehr or in the gap between the float bath and the annealing lehr.

The gaseous mixture reacts at or near the deposition surface of the glass substrate to form the titanium oxide coating thereover. The CVD process results in the deposition of a high quality titanium oxide coating on the glass substrate. In particular, the titanium oxide coating formed using the CVD process exhibits excellent coating thickness uniformity. In an embodiment, the titanium oxide coating is a pyrolytic coating.

Preferably, the titanium oxide coating formed over the glass substrate has a high refractive index. For example, the titanium oxide coating may have a refractive index of 2.1 or more. More preferably, the titanium oxide coating has a refractive index of 2.3 or more. Forming a titanium oxide coating having a high refractive index permits desired optical effects to be achieved when the coating is used in, for example, combination with other coating layers or a particular application like an architectural glazing.

Preferably, the titanium oxide coating is formed directly on the glass substrate. In this embodiment, the glass substrate is uncoated such that there are no other coating layers that separate the titanium oxide coating from the deposition surface of the glass substrate. In other embodiments, the titanium oxide coating may be formed over one or more previously deposited coating layers. The previously deposited coating layer(s) may be formed in conjunction with the float glass manufacturing process or as part of another manufacturing process and may be formed by pyrolysis or by another coating deposition process, and/or by utilizing one or more additional coating apparatuses. Additionally, the CVD process described herein may be utilized in combination with one or more additional coating layers formed over the titanium oxide coating to achieve a desired coating stack. The additional coating layer(s) may be formed in conjunction with the float glass manufacturing process shortly after forming the titanium oxide coating or as part of another manufacturing process. Also, these additional coating layers may be formed by pyrolysis or by another coating deposition process, and/or by utilizing one or more additional coating apparatuses.

As discussed, above, the CVD process may be carried out in conjunction with the manufacture of the glass substrate in the well-known float glass manufacturing process. The float glass manufacturing process is typically carried out utilizing a float glass installation such as the installation 10 depicted in the FIGURE. However, it should be understood that the float glass installation 10 described herein is only illustrative of such installations.

As illustrated in the FIGURE, the float glass installation 10 may comprise a canal section 20 along which molten glass 19 is delivered from a melting furnace, to a float bath section 11 wherein the glass substrate is formed. In this embodiment, the glass substrate will be referred to as a glass ribbon 8. The glass ribbon 8 is a preferable substrate on which the titanium oxide coating is deposited. However, it should be appreciated that the glass substrate is not limited to being a glass ribbon.

The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure 18 in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of the titanium oxide coating preferably takes place in the float bath section 11, although it may be possible for deposition to take place further along the glass production line, for example, in the gap 28 between the float bath 11 and the annealing lehr 12, or in the annealing lehr 12.

As illustrated in the FIGURE, the coating apparatus 9 is shown within the float bath section 11. However, the titanium oxide coating formed by the CVD process may be deposited by forming a plurality of titanium oxide coating layers consecutively. Thus, depending on the thickness of the titanium oxide coating desired, the titanium oxide coating may be formed utilizing one coating apparatus 9 or a plurality of coating apparatuses.

A suitable non-oxidizing atmosphere, generally nitrogen or a mixture of nitrogen and hydrogen in which nitrogen predominates, is maintained in the float bath section 11 to prevent oxidation of the molten tin 15 comprising the float bath. The glass ribbon is surrounded by float bath atmosphere. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For purposes of the describing the invention, the above-noted pressure range is considered to constitute normal atmospheric pressure.

The titanium oxide coating is preferably formed at essentially atmospheric pressure. Thus, the pressure of the float bath section 11, annealing lehr 12, and/or in the gap 28 between the float bath 11 and the annealing lehr 12 may be essentially atmospheric pressure.

Heat for maintaining the desired temperature regime in the float bath section 11 and the enclosure 18 is provided by radiant heaters 25 within the enclosure 18. The atmosphere within the lehr 12 is typically atmospheric air, as the cooling section 13 is not enclosed and the glass ribbon 8 is therefore open to the ambient atmosphere. The glass ribbon 8 is subsequently allowed to cool to ambient temperature. To cool the glass ribbon 8, ambient air may be directed against the glass ribbon 8 as by fans 26 in the cooling section 13. Heaters (not depicted) may also be provided within the annealing lehr 12 for causing the temperature of the glass ribbon 8 to be gradually reduced in accordance with a predetermined regime as it is conveyed therethrough.

EXAMPLES

The following examples are presented solely for the purpose of further illustrating and disclosing the embodiments of the CVD process.

Examples of the CVD process within the scope of the invention are described below and illustrated in TABLEs 1-3. In TABLE 1, TABLE 2 and TABLE 3, the coated glass articles within the scope of the invention are Ex 1-Ex 7. Comparative examples, not considered to be a part of the invention, are also described below and illustrated in TABLE 1.

In TABLE 1, an illustrative example and an embodiment of the CVD process which is within the scope of the invention is designated as Ex 1. Two comparative examples are designated as C1 and C1'. Also, in TABLE 1, the columns listing properties of the titanium oxide coatings deposited in accordance with Ex 1, C1 and C1' are designated with a $TiO_2$.

A soda-lime-silica glass substrate was utilized in examples Ex 1, C1 and C1'. The glass substrate utilized in each of Ex 1, C1 and C1' was moving and formed in conjunction with the float glass manufacturing process for Ex 1, C1 and C1'. The deposition surface of the glass substrate was at essentially atmospheric pressure.

The resulting coated glass article of Ex 1 is of a glass/titanium oxide arrangement. The titanium oxide coating was deposited directly on the glass substrate. For C1, a silica coating was deposited on the glass substrate prior to forming the titanium oxide coating thereover. Thus, the resulting coated glass article of C1 is of a glass/silica/titanium oxide arrangement. For C1', a nucleation coating layer was not utilized.

A gaseous mixture comprising certain precursor compounds was formed for each of Ex 1, C1 and C1'. The amounts of the individual gaseous precursor compounds are as listed in TABLE 1. The gaseous mixtures utilized for Ex 1, C1 and C1' also comprised inert gases which made up the balance of the gaseous mixtures. The line speed for Ex 1, C1 and C1', i.e. the speed of the glass substrate moving beneath the coating apparatus from which the gaseous precursor compounds were delivered, was 7.80 m/min.

The titanium oxide coating thicknesses reported in TABLE 1 were calculated using reflection. The deposition rate of each titanium oxide coating (if a coating was deposited) is also reported in TABLE 1. A titanium oxide coating was not observed to have been deposited for C1'.

TABLE 1

| Examples and Comparative Examples | Nucleation coating layer | % $TiCl_4$ | % EtoAc | % HF | Thickness $TiO_2$ (Å) | Deposition rate $TiO_2$ (Å/second) |
|---|---|---|---|---|---|---|
| C1 | $SiO_2$ | 0.19 | 0.38 | 0.0 | 185 | 61 |
| C1' | N/A | 0.19 | 0.38 | 0.0 | 0 | 0 |
| Ex 1 | N/A | 0.19 | 0.38 | 1.16 | 200 | 66 |

Ex 1 illustrates the effect of utilizing a fluorine-containing compound to form the titanium oxide coating. As illustrated by Ex 1, when a fluorine-containing compound such as, for example, hydrogen fluoride is utilized in a gaseous mixture which also comprises a titanium-containing compound such as titanium tetrachloride and an oxygen-containing compound such as ethyl acetate, a titanium oxide coating can be deposited directly on the glass substrate. It should also be noted that for Ex 1, the ratio of ethyl acetate to titanium tetrachloride in the gaseous mixture was 2:1.

As shown in TABLE 1, the CVD process illustrated by Ex 1 offers improvements over the deposition processes of C1 and C1'. For example, in order to deposit a titanium oxide coating utilizing the deposition process of C1, a coating of silica is deposited first on the glass substrate. Additionally, it should be noted that the titanium oxide coating of C1 was formed at a lower deposition rate than the titanium oxide coating deposition rate observed for Ex 1. Furthermore, as observed from comparative process C1', when the nucleation coating layer of silica is not provided, a titanium oxide coating does not form on the glass substrate. However, for Ex 1, a titanium oxide coating having a thickness of 200 Å was deposited at a deposition rate of 66 Å/second directly on the deposition surface of the moving glass substrate.

Additional examples of the CVD process within the scope of the invention are described below and illustrated in TABLE 2. In TABLE 2, coated glass articles within the scope of the invention are Ex 2-Ex 5. Also, in TABLE 2, the columns listing properties of the titanium oxide coatings deposited in accordance with Ex 2-Ex 5 are designated with a $TiO_2$.

A soda-lime-silica glass substrate was utilized in examples Ex 2-Ex 5. The glass substrate utilized in each of Ex 2-Ex 5 was moving and formed in conjunction with the float glass manufacturing process. The deposition surface of the glass substrate was at essentially atmospheric pressure.

A gaseous mixture comprising certain precursor compounds was formed for each of Ex 2-Ex 5. The amounts of the individual gaseous precursor compounds are as listed in TABLE 2. The gaseous mixtures utilized for Ex 2-Ex 5 also comprised inert gases which made up the balance of each gaseous mixture. The line speed for Ex 2-Ex 5 was 9.63 m/min. The titanium oxide coating formed in each of Ex 2-Ex 5 was deposited directly on the glass substrate.

The coated glass articles that resulted from Ex 2-Ex 5 were each of a glass/titanium oxide arrangement. The titanium oxide coating thicknesses reported in TABLE 2 were calculated using reflection. The deposition rate of each titanium oxide coating is also reported in TABLE 2. The haze exhibited by each coated glass article resulting from Ex 2-Ex 5 was measured on the coating side of the coated glass article using a haze meter and is expressed as a percentage in TABLE 2.

TABLE 2

| Examples | Nucleation coating layer | % TiCl$_4$ | % EtoAc | % HF | % O$_2$ | Thickness TiO$_2$ (Å) | Deposition rate TiO$_2$ (Å/second) | Haze |
|---|---|---|---|---|---|---|---|---|
| Ex 2 | N/A | 0.18 | 0.46 | 2.38 | 0.0 | 160 | 42.67 | 0.20 |
| Ex 3 | N/A | 0.18 | 0.46 | 2.38 | 1.59 | 170 | 45.33 | 0.25 |
| Ex 4 | N/A | 0.18 | 0.46 | 2.38 | 3.17 | 170 | 45.33 | 0.27 |
| Ex 5 | N/A | 0.18 | 0.46 | 2.38 | 6.35 | 170 | 45.33 | 0.26 |

For Ex 2-Ex 5, the ratio of ethyl acetate to titanium tetrachloride in the gaseous mixture was about 2.5:1. For Ex 2, a titanium oxide coating having a thickness of 160 Å was deposited at a deposition rate of 42.67 Å/second directly on the deposition surface of the moving glass substrate. In Ex 3-Ex 5, the effect of utilizing a second oxygen-containing compound to form the titanium oxide coating is illustrated. For Ex 3-Ex 5, a titanium oxide coating having a thickness of 170 Å was deposited at a deposition rate of 45.33 Å/second directly on the deposition surface of the moving glass substrate. Thus, as shown by comparing Ex 2 with Ex 3-Ex 5, when the gaseous precursor mixture includes a first oxygen-containing compound as described above and a second oxygen-containing compound as described above, a titanium oxide coating can be deposited directly on the glass substrate at a deposition rate which is greater than the deposition rate of a titanium oxide coating formed utilizing a precursor mixture which includes only a first oxygen-containing compound. Also, it should be noted that the coated glass articles resulting from Ex 2-Ex 5 exhibited haze of less than 0.3%.

Additional examples of the CVD process within the scope of the invention are described below and illustrated in TABLE 3. In TABLE 3, coated glass articles within the scope of the invention are Ex 6 and Ex 7. Also, in TABLE 3, the columns listing properties of the titanium oxide coatings deposited in accordance with Ex 6 and Ex 7 are designated with a TiO$_2$.

A soda-lime-silica glass substrate was utilized in examples Ex 6 and Ex 7. The glass substrate utilized in each of Ex 6 and Ex 7 was moving and formed in conjunction with the float glass manufacturing process. The deposition surface of the glass substrate was at essentially atmospheric pressure.

A gaseous mixture comprising certain precursor compounds was formed for each of Ex 6 and Ex 7. The amounts of the individual gaseous precursor compounds are as listed in TABLE 3. The gaseous mixtures utilized for Ex 6 and Ex 7 also comprised inert gases which made up the balance of each gaseous mixture. The line speed for Ex 6 and Ex 7 was 9.63 m/min.

The titanium oxide coating formed in each of Ex 6 and Ex 7 was deposited directly on the glass substrate. A silica coating was deposited over the glass substrate after forming the titanium oxide coating thereon. Thus, the coated glass articles that resulted from Ex 6 and Ex 7 were each of a glass/titanium oxide/silica arrangement.

The silica coatings formed on the titanium oxide coatings in Ex 6 and Ex 7 were each calculated to be of a thickness of about 400 Å and were calculated using reflection. The titanium oxide coating thicknesses reported in TABLE 3 were also calculated using reflection. The deposition rate of each titanium oxide coating is also reported in TABLE 3. The haze exhibited by each coated glass article resulting from Ex 6 and Ex 7 was measured on the coating side of the coated glass article using a haze meter and is expressed as a percentage in TABLE 3.

TABLE 3

| Examples | Nucleation coating layer | % TiCl$_4$ | % EtoAc | % HF | % O$_2$ | Thickness TiO$_2$ (Å) | Deposition rate TiO$_2$ (Å/second) | Haze |
|---|---|---|---|---|---|---|---|---|
| Ex 6 | N/A | 0.18 | 0.46 | 2.38 | 6.35 | 170 | 45.33 | 0.46 |
| Ex 7 | N/A | 0.18 | 0.46 | 2.38 | 0.0 | 160 | 42.67 | 0.47 |

As noted above, when the titanium oxide coating was the outermost coating layer on the glass substrate, the coated glass articles resulting from Ex 2-Ex 5 exhibited haze of less than 0.3%. However, with the addition of a coating layer such as, for example, a silica coating over the titanium oxide coating, the coated glass articles resulting from Ex 6 and Ex 7 exhibited haze of greater than 0.45%. Hence, by forming one or more coating layers over the titanium oxide layer, the haze can be increased. Thus, by selecting the position of the titanium oxide coating on the coated glass article, the haze exhibited by a coated glass article having a titanium oxide coating formed by the CVD process can be increased or decreased.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention as defined by the claims which follow.

The invention claimed is:

1. A chemical vapor deposition process for depositing a titanium oxide coating, comprising:
   providing a glass substrate having a deposition surface;
   forming a gaseous mixture comprising an inorganic titanium-containing compound, a first oxygen-containing compound, and a fluorine-containing compound, wherein the gaseous mixture is formed prior to being fed through a coating apparatus; and
   directing the gaseous mixture toward and along the glass substrate, and reacting the mixture over the glass substrate to form the titanium oxide coating directly on the deposition surface such that there are no other coatings that separate the titanium oxide coating from the deposition surface.

2. The chemical vapor deposition process defined in claim 1, wherein the gaseous mixture includes the first oxygen-containing compound and a second oxygen-containing compound.

3. The chemical vapor deposition process defined in claim 1, wherein the titanium oxide coating is a titanium dioxide coating which contains only trace amounts of or less fluorine.

4. The chemical vapor deposition process defined in claim 1, wherein the titanium oxide coating is titanium dioxide and has a refractive index of 2.1 or more.

5. The chemical vapor deposition process defined in claim 1, wherein the inorganic titanium-containing compound is a halogenated compound.

6. The chemical vapor deposition process defined in claim 1, wherein the fluorine-containing compound is an inorganic fluorine-containing compound.

7. The chemical vapor deposition process defined in claim 1, wherein the glass substrate is moving as the titanium oxide coating is being formed.

8. The chemical vapor deposition process defined in claim 1, wherein a deposition surface of the glass substrate is at essentially atmospheric pressure when the titanium oxide coating is formed thereon.

9. The chemical vapor deposition process defined in claim 1, further comprising feeding the gaseous mixture through a coating apparatus and discharging the gaseous mixture from the coating apparatus, wherein the coating apparatus is provided at a predetermined distance above and extends transversely across the glass substrate.

10. The chemical vapor deposition process defined in claim 1, wherein the glass substrate is at a temperature of between about 1100° F. (593° C.) and 1400° F. (760° C.) when the titanium oxide coating is formed thereon.

11. The chemical vapor deposition process defined in claim 1, wherein the inorganic titanium-containing compound is a halogenated compound, the first oxygen-containing compound is an ester having an alkyl group with a β hydrogen, and the fluorine-containing compound is an inorganic fluorine-containing compound.

12. The chemical vapor deposition process defined in claim 2, wherein the first oxygen-containing compound is an oxygen-containing organic compound and the second oxygen-containing compound is an oxygen-containing inorganic compound.

13. The chemical vapor deposition process defined in claim 5, wherein the inorganic, halogenated titanium-containing compound is titanium tetrachloride.

14. The chemical vapor deposition process defined in claim 6, wherein the fluorine-containing compound is hydrogen fluoride.

15. An atmospheric pressure chemical vapor deposition process for depositing a titanium oxide coating, comprising:
   providing a glass ribbon in a float glass manufacturing process;
   forming a gaseous mixture comprising an inorganic, halogenated titanium containing compound, an oxygen-containing organic compound, an inorganic fluorine-containing compound and one or more inert gases;
   delivering the gaseous mixture to a coating apparatus provided at a predetermined distance above and extending transversely across the glass ribbon, the glass ribbon being surrounded by float bath atmosphere; and
   discharging the gaseous mixture from the coating apparatus and directing the gaseous mixture toward and along the glass ribbon, and reacting the mixture over the glass ribbon to form the titanium oxide coating directly thereon.

16. The chemical vapor deposition process defined in claim 15, wherein the titanium oxide coating comprises titanium dioxide and exhibits a refractive index of 2.1 or more.

17. The chemical vapor deposition process defined in claim 15, wherein the gaseous mixture further comprises $O_2$.

18. An atmospheric pressure chemical vapor deposition process for depositing a titanium oxide coating, comprising:
   providing a moving glass substrate having an uncoated deposition surface at essentially atmospheric pressure;
   mixing titanium tetrachloride, ethyl acetate, and hydrogen fluoride and one or more inert gases to form a gaseous mixture;
   delivering the gaseous mixture to a coating apparatus provided at a predetermined distance above the glass substrate; and
   discharging the gaseous mixture from the coating apparatus and directing the gaseous mixture toward and along the glass substrate, and reacting the mixture over the deposition surface of the glass substrate to form a titanium dioxide coating directly thereon, wherein the titanium dioxide coating has a refractive index of 2.1 or more.

19. The chemical vapor deposition process defined in claim 18, wherein the glass substrate is at a temperature of between about 1100° F. (593° C.) and 1400° F. (760° C.) when the titanium oxide coating is deposited thereon.

* * * * *